US012748902B2

(12) United States Patent
Grehant

(10) Patent No.: US 12,748,902 B2
(45) Date of Patent: Sep. 29, 2026

(54) SIMILARITY SEARCH OF INDUSTRIAL COMPONENTS MODELS

(71) Applicant: DASSAULT SYSTEMES, Velizy-Villacoublay (FR)

(72) Inventor: Xavier Grehant, Paris (FR)

(73) Assignee: DASSAULT SYSTEMES, Velizy-Villacoublay (FR)

( * ) Notice: Subject to any disclaimer, the term of this patent is extended or adjusted under 35 U.S.C. 154(b) by 1047 days.

(21) Appl. No.: 17/307,951

(22) Filed: May 4, 2021

(65) Prior Publication Data

US 2021/0349429 A1 Nov. 11, 2021

(30) Foreign Application Priority Data

May 5, 2020 (EP) .................................... 20305443

(51) Int. Cl.
*G06N 3/08* (2023.01)
*G05B 13/02* (2006.01)
(Continued)

(52) U.S. Cl.
CPC ........... *G06F 30/27* (2020.01); *G05B 13/027* (2013.01); *G05B 13/048* (2013.01); (Continued)

(58) Field of Classification Search
None
See application file for complete search history.

(56) References Cited

U.S. PATENT DOCUMENTS

2016/0300118 A1* 10/2016 Murray .................. G06V 10/56
2018/0157682 A1* 6/2018 Wakabayashi .......... G06F 18/22
(Continued)

FOREIGN PATENT DOCUMENTS

CN 10299218 A 11/2008
JP 2006-520948 A 9/2006
JP 2017-208092 A 11/2017
JP 2019-153279 A 9/2019

OTHER PUBLICATIONS

Sean Billings; "Gradient Augmented Information Retrieval with Autoencoders and Semantic Hashing (L101 Michaelmas 2017)", arXiv:1803.04494v1, [cs.IR]; Mar. 12, 2018; 9 pgs.
Zhong-Min Huangfu, et al.; "A Method of 3D CAD Model Retrieval Based on Spatial Bag of Words"; Multimed Tools Appl (2017) 76:8145-8173; DOI 10.1007/s11042-016-3456-5; 29 pgs.
(Continued)

*Primary Examiner* — Xuyang Xia
(74) *Attorney, Agent, or Firm* — Oblon, McClelland, Maier & Neustadt, L.L.P.

(57) ABSTRACT

A computer implemented method for improving a similarity search of an industrial component model including obtaining a set of industrial component models, each having associated attributes and a similarity embedding, receiving a similarity request using a given industrial component model as an input, the output of said similarity request being a first subset of industrial component models selected from the set of industrial component models based on the comparison between similarity embeddings and the similarity embedding of the input industrial component model, receiving a second subset of industrial component models from said first subset of industrial component models based on an interchangeability criteria of the input industrial component model with any industrial component model of said second subset of industrial component models, associating a similarity attribute to the input industrial component model, and computing a new set of similarity embeddings.

18 Claims, 3 Drawing Sheets

(51) Int. Cl.

| | |
|---|---|
| ***G05B 13/04*** | (2006.01) |
| ***G05B 23/02*** | (2006.01) |
| ***G06F 18/22*** | (2023.01) |
| ***G06F 30/27*** | (2020.01) |

(52) U.S. Cl.
CPC ......... *G05B 23/0281* (2013.01); *G06F 18/22* (2023.01); *G06N 3/08* (2013.01)

(56) References Cited

U.S. PATENT DOCUMENTS

| | | | | |
|---|---|---|---|---|
| 2018/0196796 | A1* | 7/2018 | Wu | G06F 40/289 |
| 2019/0236139 | A1* | 8/2019 | DeFelice | G06N 3/044 |
| 2020/0042580 | A1* | 2/2020 | Davis | G06F 16/93 |
| 2020/0090049 | A1* | 3/2020 | Aliper | G06F 18/2137 |
| 2020/0133964 | A1* | 4/2020 | Lee | G06F 16/355 |
| 2020/0286112 | A1* | 9/2020 | Zhou | G06N 3/045 |
| 2020/0311616 | A1* | 10/2020 | Rajkumar | G06N 3/08 |
| 2021/0326393 | A1* | 10/2021 | Aggarwal | G06N 3/09 |

OTHER PUBLICATIONS

Ashwin T.V., et al.; "Adaptable Similarity Search Using Non-Relevant Information", Proceedings of the 28$^{th}$ VLDB Conference, Hong Kong, China. 2002; 12 pgs.

Office Action dated Mar. 25, 2025, issued in counterpart JP Application No. 2021-077405, w/English Translation, (7 pages).

Bi, Keping et al., "Leverage Implicit Feedback for Context-aware Product Search", arXiv: 1909.02065v2, pp. 1-10, Jan. 9, 2020. (10 pages).

Office Action dated Sep. 12, 2025, issued in counterpart CN Application No. 202110490299.3, with English translation. (23 pages).

* cited by examiner

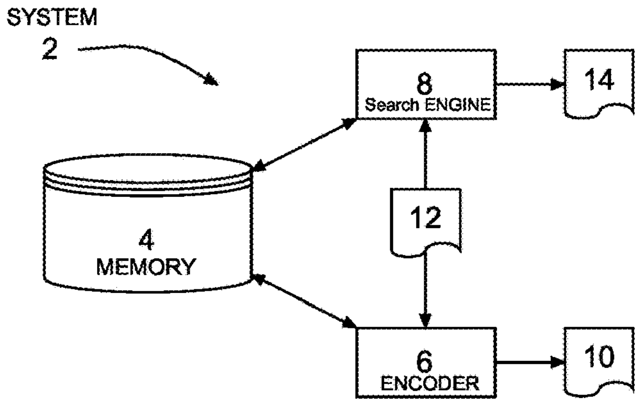

Fig.1

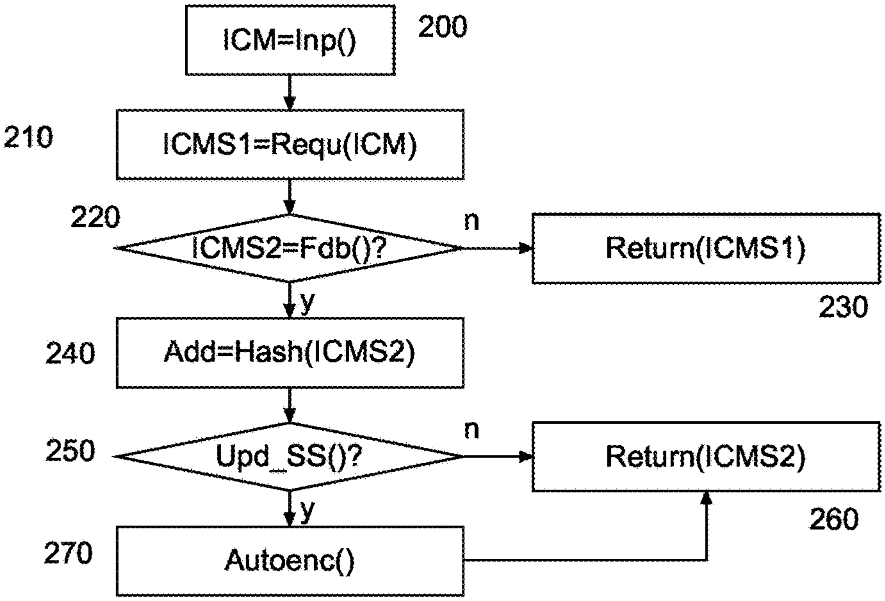

Fig.2

Fig.3

30 32 34

| Component ID | Description | Material | Shape signature | ... | Similarity data |
|---|---|---|---|---|---|
| [illegible] | Lorem ipsum dolor sit amet | Aluminum | [illegible] | ... | [illegible] |
| [illegible] | sed do eiusmod tempor | Steel | [illegible] | ... | [illegible] |
| [illegible] | incididunt ut labore | Aluminum | [illegible] | ... | [illegible] |

30 32 34

| Component ID | Description | Type | Nominal capacitance | Working voltage | ... | Similarity data |
|---|---|---|---|---|---|---|
| [illegible] | Lorem ipsum dolor sit | Capacitor | 4700uF | 25V | ... | [illegible] |
| [illegible] | sed do eiusmod | Resistor | [illegible] | 75V | ... | [illegible] |
| [illegible] | incididunt ut labore | Capacitor | 4700 uF | 25V | ... | [illegible] |

Fig.4

| Component ID | Description lorem | Desription Ipsum | ... | Material Aluminum | Material Steel | ... | Shape signature 1 | Shape signature 2 | ... | Similarity data f74f0310 | Similarity data d45c714e | Similarity data 99089de4 | ... |
|---|---|---|---|---|---|---|---|---|---|---|---|---|---|
| HF059210 | 1 | 1 | ... | 1 | 0 | ... | 12352 | 9.3453 | ... | 1 | 1 | 1 | ... |
| ZW049285 | 0 | 0 | ... | 0 | 1 | ... | 32552 | 8.1153 | ... | 0 | 0 | 0 | ... |
| GJ154003 | 0 | 0 | ... | 1 | 0 | ... | 13078 | 9.3001 | ... | 0 | 1 | 1 | ... |

Fig.7

| Component ID | Description lorem | Desription Ipsum | ... | Type Capacitor | Type Resistor | ... | Nominal capacitance (uF) | Working voltage (V) | ... | Similarity data f74f0310 | Similarity data d45c714e | Similarity data 99089de4 | ... |
|---|---|---|---|---|---|---|---|---|---|---|---|---|---|
| HF059210 | . | 1 | ... | 1 | 0 | ... | 4700 | 25 | ... | 1 | 1 | 1 | ... |
| ZW049285 | 0 | 0 | ... | 0 | 1 | ... | 0.00005 | 75 | ... | 0 | 0 | 0 | ... |
| GJ154003 | 0 | 0 | ... | 1 | 0 | ... | 4700 | 23 | ... | 0 | 1 | 1 | ... |

Fig.8

SIMILARITY SEARCH OF INDUSTRIAL COMPONENTS MODELS

CROSS-REFERENCE TO RELATED APPLICATIONS

This application claims priority under 35 U.S.C. § 119 or 365 to European Application No. 20305443.2, filed May 5, 2020. The entire contents of the above application(s) are incorporated herein by reference.

FIELD

The disclosure concerns a computer-implemented method for improving search of an industrial component model.

BACKGROUND

When performing design work, whether for a mechanical object or for an electronic circuit, it is generally preferred to use parts which exhibit replaceability. By replaceability it is meant that a given pan may be replaced by another part in the design without altering the specifications required for the final product.

In that regards, the identification of parts which can be used to replace each other is a challenging task, but also a crucial one in order to streamline sourcing and to reuse parts whose behavior is well known, and thus improve the reliability of the designs.

In the case of electronic parts, this may be done by the manufacturers themselves, by defining standardized data relating to the fit, form and function of parts. In the case of mechanical parts, this is usually done by creating signatures for each part, which is based on the topological analysis of the part shape. The article "Harmonic 3D shape matching" by Kazdhan et al., SIGGRAPH Sketches and Applications (2002) shows an example of one such method.

These methods all rely on theoretical models. This means that the way they function is more or less immutable, unless one alters the models themselves. As a result, these methods provide little adaptability to situations which were not factored in during the modelling, and offer very little flexibility.

On a totally different level, there are methods which are used to take into account user feedback, some of which use some form of clustering, when performing a search. These techniques are performed as a "polishing step" which reorders or reshuffles the results of a given search based on user feedback. However, they are not embedded in the search itself, and only alter the results list. This means that the feedback is never really taken into account in the search itself, and that the user feedback changes parts of the display process, not the object representations themselves. As a result, the changes do not affect other applications, and in particular, will not affect subsequent clustering of the components which are the object of the search.

SUMMARY

The disclosure is able to improve the situation. To this end, Applicant describes a computer-implemented method for improving a similarity search of an industrial component model including:

- providing a set of industrial component models, each having associated attributes and a similarity embedding being an embedding of at least some of said associated attributes;

- receiving a similarity request using a given industrial component model as an input, the output of said similarity request being a first subset of industrial component models selected from the set of industrial component models based on the comparison between their similarity embeddings and the similarity embedding of the input industrial component model;
- receiving a second subset of industrial component models selected by a user from said first subset of industrial component models based on an interchangeability criteria of the input industrial component model with any industrial component model of said second subset of industrial component models;
- associating a similarity attribute to the input industrial component model, said attribute being a unique ID defined by said similarity request and/or said second subset of industrial component models; and
- computing a new set of similarity embeddings.

This method is advantageous because it allows to define new signatures which take into account not only legacy replaceability data, but also user feedback. This allows creation of interchangeability classes, which are practically a mix of the existing theoretical models with an empirically induced clusterization. Furthermore, since the method uses the existing industrial component model attributes conventionally used as its foundation layer, the initialization of the method is easy to put in place, and yields from the start the same performance level as the existing methods, with a steep improvement curve as soon as user-feedback starts to be incorporated. Furthermore, the user-feedback allows taking into account of information which is impossible to modelize and provides a fuzzy-logic type and more robust approach to interchangeability. In other words, it allows generalization of the concept of replaceability, which is necessarily restricted to a strict context, to interchangeability, which is replaceability in a fuzzier context, without sacrificing the quality of results.

In various embodiments, the method may present one or more of the following features:

- the similarity embeddings are embedded by vectorization of the industrial component models attributes, and by embedding of the resulting vectorized data;
- the embedding is performed by a context sensitive autoencoder comprising an encoder and a decoder which are both neural networks in which:
- the input of the autoencoder is said vectorized data and constitutes the input of
- the encoder, and the output of the encoder constitutes the similarity embeddings,
- the input of the decoder is the similarity embeddings, and the output of the decoder is a term frequency-inverse document frequency of said vectorized data, said encoder and decoder are tuned such that the term frequency-inverse document frequency of said vectorized data best approximates said vectorized data;
- the embedding is performed by performing a principal component analysis on the concatenation of an L1-normalization of the attributes with a chosen weight multiplied by the L1-normalization of the similarity attributes;
- the vectorization is performed by a doc2vec vectorization of the text attributes, and by a vectorization of the similarity attribute which comprises adding a column for each unique ID, and, for each industrial component model, filling this column with 1 if the industrial component model is associated with this unique ID, and 0 otherwise; and the vectorization is performed by applying a Bidirectional Encoder Representations from Transformers technique to the industrial component models.

The disclosure also describes a computer program comprising instructions for performing the method according to the invention, a data storage medium having recorded thereon such a computer program and a computer system comprising a processor coupled to a memory, the memory having recorded thereon such a computer program.

BRIEF DESCRIPTION OF THE DRAWINGS

Other features and advantages of the disclosure will readily appear in the following description of the drawings, which show exemplary embodiments and on which:

FIG. 1 shows a general diagram view of a system;

FIG. 2 shows an exemplary embodiment of a function executed by the system of FIG. 1;

FIG. 3 shows a table containing exemplary mechanical parts industrial component models, whereas of FIG. 4 shows a table containing exemplary electronic parts industrial component models;

FIG. 7 and FIG. 8 show exemplary results of the vectors obtained after applying the function of FIG. 5 respectively to the industrial component models of FIG. 3 and FIG. 4, prior to feeding the autoencoder of FIG. 6.

DETAILED DESCRIPTION

Figure 5:
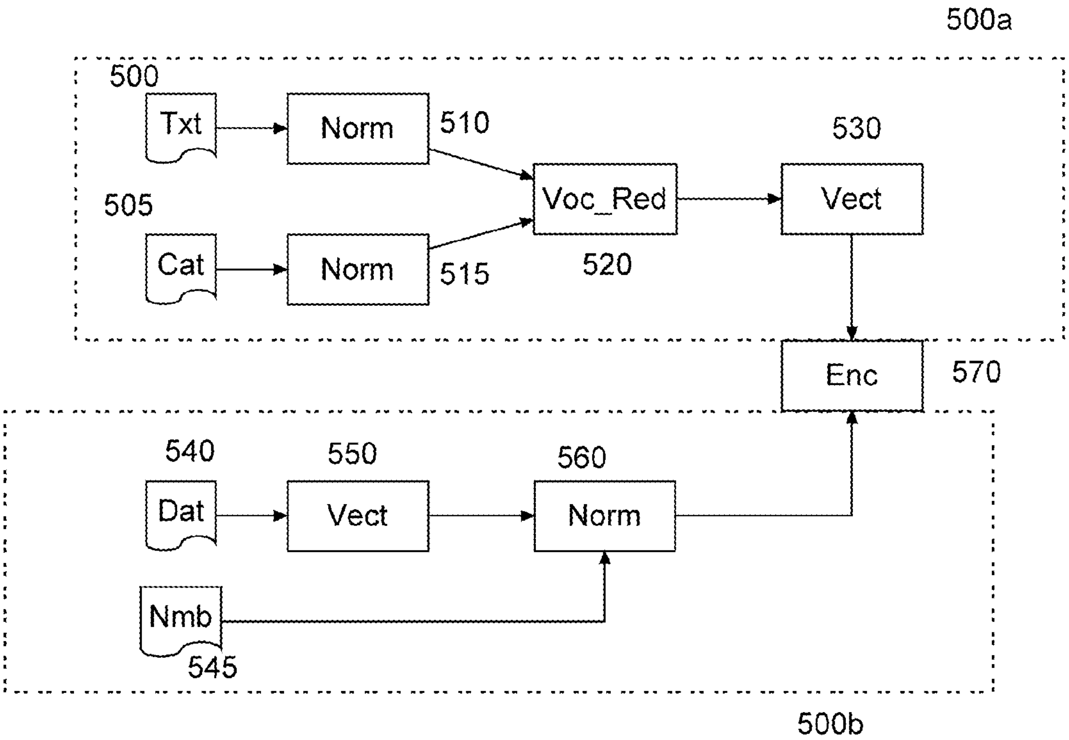
FIG. 5 shows an exemplary embodiment of a function for computing similarity embeddings.

The drawings and the following description are comprised of positive and well-defined features. As a result, they are not only useful in understanding the disclosure, but they can also be used to contribute to its definition, should the need arise.

The description may make reference or use elements protected or protectable by copyright. The Applicant does not object to the reproduction of those elements in as much as it is limited to the necessary legal publications, however this should not be construed as a waiver of rights or any form of license.

FIG. 1 shows a general diagram view of a system according to the disclosure. The system 2 comprises a memory 4 an encoder 6 and a similarity search engine 8.

The memory 4 stores industrial component model data. The industrial component model data comprises any data which allows definition of a mechanical or electronic part, as well as attributes which allow to describe the industrial component model to a designer as well as to search for this industrial component model. Furthermore, an industrial component model may also be an assembly of parts which may or may not themselves have industrial component model data.

In the example described herein, the memory 4 may be realized in any way suitable that is by way of a hard disk drive, a solid-state drive, a flash memory, a memory embedded in a processor, a distant storage accessible in the cloud, etc.

In the example described herein, the memory 4 associates a similarity embedding 10 with each industrial component model. This similarity embedding, which will be further described below allows definition of an interchangeability measure between industrial component models being considered. For a given industrial component model, the signature is not a mere aggregation or compression of the attributes of the industrial component model but an element which is computed using user feedback information which allows to associate industrial component models in way impossible in the conventional art.

Figure 6:
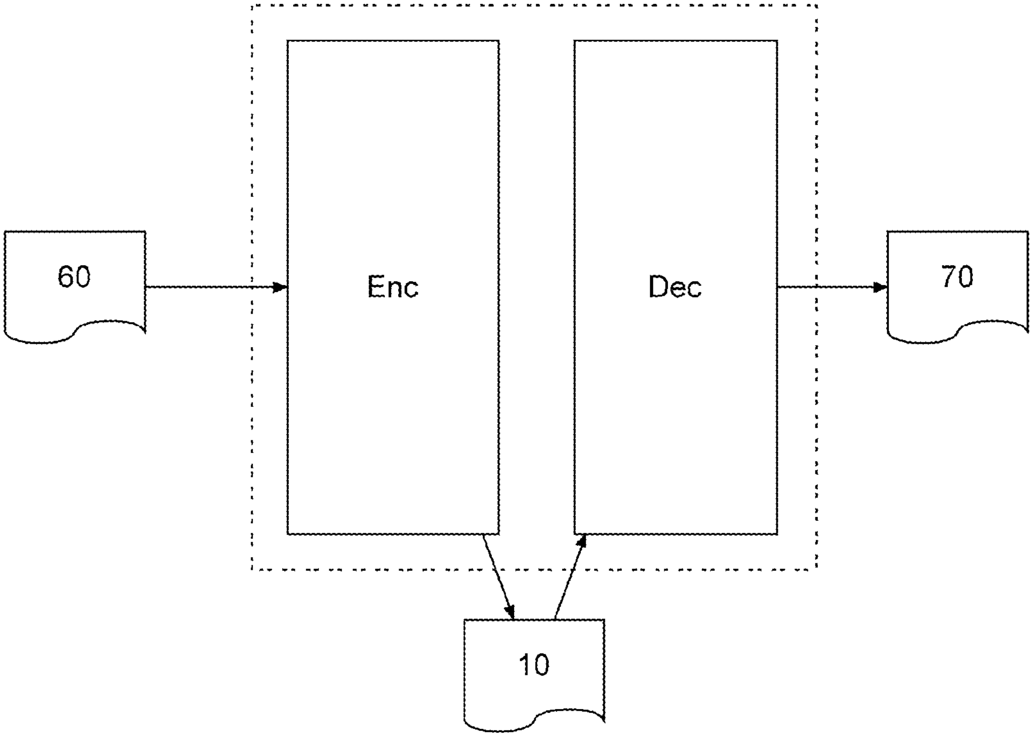
FIG. 6 shows an exemplary structure of an autoencoder used in the function of FIG. 5.

In order to compute a similarity embedding 10 according to the disclosure, the system 2 uses the encoder 6 which is a part of an autoencoder and will be described in more detail with reference to FIG. 6. As will readily appear, the similarity embedding constitutes an embedding of at least part of the attributes of the industrial component model.

In the example described herein, the encoder 6 and the similarity search engine 8 are computer programs which are executed on one or more processors. Such processors include any means known for performing automated calculus, such as CPUs, GPUs, CPUs and/or GPUs grids, remote calculus grids, specifically configured FPGAs, specifically configured ASICs, specialized chips such as SOCs or NOCs, AI specialized chips, etc.

Based on the similarity embeddings computed by the encoder 6, the similarity search engine 8 allows a user to input an industrial component model 12 and to receive in return a set of industrial component models 14 which are deemed interchangeable with the input industrial component model 12.

This return also enables the user to further improve the quality of the requests by allowing the user to specify within a return set of industrial component models a subset of industrial component models which the user deems more relevant than the others.

FIG. 2 represents an exemplary embodiment of a function executed by system 2. This exemplary embodiment represents operations that the system 2 can perform in order to execute the embodiments.

As a result, it encompasses both a runtime portion as evidenced in steps 210 to 260, and a training portion as shown in step 270. This function starts with an operation 200 in which a function Inp( ) is executed. Function Inp( ) is an input function in which an industrial component model ICM is entered as an argument which will be used as a global variable in the other steps.

This can be done by way of a human machine interface (HMI) in which a user designates or otherwise uploads a file containing the input industrial component model attributes, or designates an industrial component model entry ICM in the memory 4. Any type of HMI which can be used as long as it offers an interface through which suggestions are presented to a user, and through which this user can eliminate irrelevant suggestions, validate relevant suggestions or add industrial components. For instance, the user may identify common characteristics in the relevant suggestions, search for more industrial components that have these characteristics, and select relevant results to add to the set.

FIGS. 3 and 4 show examples of tables containing the attributes associated with industrial component models. The table of FIG. 3 contains mechanical parts industrial component models, whereas the table of FIG. 4 contains electronic parts industrial component models.

As appears in FIGS. 3 and 4, each row comprises the attributes of a single part, and the attributes are distributed across 3 types of columns:

- a single part ID column referenced 30, which is a unique identifier for each part;
- a set of feature columns referenced 32, which describe predetermined features of each part-,
- a single similarity data column referenced 34.

For example, in the case of a mechanical part (FIG. 3), these columns may include a description of the part, one or more columns detailing the materials used in this part, one or more columns for storing a shape signature of the part, one or more columns for storing the dimensions of this part, one or more columns for storing relevant measurements of this part (for example hardness, etc.), etc. Similarly, in the case of an electronic part (FIG. 4), these columns may include a part type (to describe which type of electronic function is achieved), measurements columns for describing nominal values and operating values as well as limit values, etc. All of these columns can be considered as "objective features", as they describe common measurements or features which characterize the physical properties of the part.

The similarity data column may be empty. When it is filled, it comprises a list of hash codes which allow to associate parts together. In other words, when two or more parts have been considered as similar, a unique hash code is generated to associate represent the association of these parts together, and this hash code is added in the "Similarity data" column of each of these parts. For example, turning to FIG. 3, parts HF059210 and GJ154003 have both been part of a set of parts considered similar which received the hash code 99089de4. Part HF059210 was further considered similar in two other sets, designated respectively by hash code f74f0310 and d45c714e.

Operation 200 is followed by operation 210, in which the similarity search engine 8 is queried with the input industrial component model ICM of operation 200. The similarity search engine 8 performs a search for the input industrial component model and uses its similarity embedding to determine a number of industrial component models which have a close similarity embedding. These industrial component models are returned in a first set of industrial component models ICMS1. The computation of the signature of a given industrial component model will be explained in more detail with respect to FIGS. 5 and 6.

In order to compare the similarity embeddings of the various industrial component models, the similarity search engine 8 may use a variety of measures, such as cosine similarity, or alternatively Euclidian similarity (or a variant thereof, for example after L1 or L2 normalization of the similarity embeddings), or the Manhattan similarity. The similarity search engine 8 may be arranged to return all of the industrial component models for which the above measure of similarity, applied to their similarity embedding and that of the input industrial component model, is above a given threshold. Alternatively, the similarity search engine 8 may be arranged to return a fixed number of industrial component models which similarity embedding is closest to that of the input industrial component model. The similarity search engine 8 may mix both approaches.

For clarity's sake, it should be noted that the similarity embeddings are different from the similarity data of FIGS. 3 and 4 and will be described in greater detail with respect to FIGS. 5 to 8.

In an operation 220, the first set of industrial component models is presented to a user in a function Fdb( ). Function Fdb( ) receives the set of industrial component models ICMS1 to a user, and returns a subset of industrial component models ICMS2 selected by a user because of their likely interchangeability with input industrial component model ICM.

In practice, through function Fdb( ), the user may provide feedback information by selecting the second set of industrial component models ICMS2 which is a subset of the first set of industrial component models ICMS1, and which comprises elements which he considers to be likely interchangeable from a design standpoint with the input industrial component model ICM.

Steps 210 and 220 may be repeated so that a user may enrich an existing query to add new industrial components models to the user's feedback. For example, the user may remove specific components from the results of a similarity query (resulting from a prior execution of operation 210), add other components to the results by way of a keyword query, and then validate the components remaining in the result set as similar to the input.

In this case, these repetitions are still interpreted within the scope of the disclosure as establishing a first set of industrial component models ICMS1, and reducing it to a second set of industrial component models ICMS2 which is a subset of the first set of industrial component models ICMS1.

If there is no subset, then the function of FIG. 2 ends with the return of the first set of industrial component models ICMS1 as the result of the similarity search in operation 230. Else, in operation 240, a function Hash( ) is executed. Function Hash( ) receives the second set of industrial component models ICMS2 as an input, and outputs a unique value which is one of the hash codes described with reference to FIGS. 3 and 4 which is added to the "Similarity data" column 34 of each of the industrial component models which are part of the second set of industrial component models ICMS2. The fact that this hash is unique is an important part of the definition of the similarity embedding of each industrial component model.

In operation 250, a function Upd_SS( ) is executed. Function Upd_SS( ) receives the current set of similarity embeddings, determines whether the similarity embeddings of the industrial component models in memory 4 should be updated or not, and outputs this information. The determination that the similarity embeddings should be updated may be user triggered, time-triggered, may depend on the amount of new similarity data that has been computed since the last update, or may be based on another condition. In an alternative embodiment, this operation is completely separate from operations 200 to 240.

This operation has the advantage of tailoring the moment at which the training of the autoencoder is repeated. Such tailoring is important because the training always takes a significant amount of time. As a result, it cannot be repeated too frequently, but still needs to be performed in order to take into account the user feedback in the form of the new similarity data added to the industrial component models.

If operation 250 indicates that the similarity embeddings do not need to be updated, then the function of FIG. 2 ends with the return of the second set of industrial component models ICMS2 as the result of the similarity search in operation 260. In this case, the only change that has been made is that the industrial component models of the second set of industrial component models ICMS2 have been modified to add new similarity data computed in operation 240. At this stage, the similarity embeddings attached to each industrial component model have not been changed. This means that a new query based on similarity embeddings will not show the changes introduced by the user feedback. Only when the function Autoenc( ) is executed will the similarity embeddings change, and the queries' results as a consequence.

If operation 250 indicates that the similarity embeddings do need to be updated, the encoder 6 is called upon by function Autoenc( ) to recompute the similarity embeddings in operation 270, and the function of FIG. 2 ends with the return of the second set of industrial component models ICMS2 as the result of the similarity search in operation 260. Function Autoenc( ) receives all of the industrial component models (including the added hash of operation 240 as new similarity data), and computes new similarity embeddings for each industrial component model. As will appear with the below description of FIGS. 5 to 8, it is the nature of the function Autoenc( ) which guarantees that the computed similarity embeddings take into account the similarity data to provide similarity embeddings which reflect user feedback of interchangeability.

FIG. 5 discloses an exemplary embodiment of the function Autoenc( ) of FIG. 2 for computing similarity embeddings. This function comprises two separate sets of operations for formatting and vectorizing the data of the attributes prior to a machine learning operation which outputs the similarity embeddings.

A first set of operations 500*a* is tailored toward text-like attributes. In this case, an attribute of a given industrial component model may be a text field 500 or a category name 505.

In both cases, the data undergoes a normalization in operation 510 or 515. This normalization may comprise standard steps such as removal of stop words, accents or hyphenations, lemmatization, stemming etc. Operations 510 and 515 are optional and may be omitted, in particular for category name 505 attributes. Further optionally, phrase detection may also be used. The concept of phrase should be understood as a multiword expression detection; where expressions replace words to become the units of meaning. Phrase detection is very useful when the vectorization is performed with a bag of words representation, as each expression becomes a dimension in the bag of words representation. Phrase detection may be omitted when the vectorization is performed with a doc2vec representations.

According to a first embodiment, the vectorization is performed with a bag of words approach. In this case, after all text data has been normalized, it undergoes a vocabulary reduction operation 520, in order to keep only the highest frequency terms. Finally, the resulting tokens are vectorized, using the bag of words representation. As it is known, in a bag of words representation, each document is mapped onto a space where each dimension of the space corresponds to a word of the vocabulary. The coordinate of the document on each dimension is typically the TFIDF (term frequency-inverse document frequency) of the word for the document. Alternatively, instead of the TFIDF, the count of the number of occurrences of the word in the document can also be used. The similarity data is vectorized by creating one column added to the attributes for each individual hash code, and by filling it with 1 if a given component comprises a hash code in its similarity data column, and 0 else.

According to another embodiment, the vectorization may be performed using neural network-based document embedding methods.

A first neural network-based document embedding method that can be used is a Word2vec or a Doc2vec method. In this case, operations 510 and 515 remain optional, and operation 520 is omitted. Word2vec is a neural network based vectorization of words, that learns to produce representations of words by trying to predict a word from its neighboring words (or vice versa) and fine tuning the representation of each word in the process. Doc2vec is a similar algorithm, but it also adds a representation of the document in input, and fine-tunes this representation in the process, as well.

A second neural network-based document embedding method that can be used is a BERT (Bidirectional Encoder Representations from Transformers) technique. In this case, operations 510 and 515 remain optional, operation 520 is omitted. BERT is an algorithm based on a deep network construct that consists in learning what other words are important to look for in the context of a word for which the network is constructing a representation. For instance, it might learn to look for "forest" or "engine" when representing "fire", because the presence of these words may change the interpretation of "fire". BERT is typically trained to predict hidden words or predict the next words, on large text corpuses, such as Wikipedia. While document vectorization is not the primary purpose of BERT, the outputs of certain layers of a BERT model can provide useful document vectors.

A second set of operations is tailored toward number-like attributes. In this case, a given industrial component model may be a date field 540 or a number field 545. In the former case, the data undergoes a vectorization in operation 550. After all numerical data has been vectorized, it undergoes a normalization operation 560, for instance based on value divided by variance of each vectorized numerical data.

In view of the above, it is clear that the vectorization operation may be tailored as needed. For example, text data may be vectorized using Doc2vec or BERT, category names may be vectorized using bag of words, etc.

FIG. 7 and FIG. 8 show exemplary results of the vectors obtained after applying these two sets of operations respectively to the industrial component models of FIG. 3 and FIG. 4.

After operations 530 and 560 have been performed the resulting vectorized data is fed into a CSAE (Context Sensitive AutoEncoder) to perform an operation 570 of machine learning. FIG. 6 shows an exemplary structure of a CSAE that can be used for that purpose.

A CSAE is a network of the class of autoencoders, or deep autoencoders. Deep autoencoders have at least three layers of neurons, each layer interconnected to the previous and the next. The middle layer is typically smaller than the input and the input and output layers have same size. Autoencoders are trained to reproduce the input. The autoencoder teams to keep as much information as possible from the input in the middle layer, in order to reconstruct the input as accurately as possible. Since the middle layer is smaller, the input layer is a compressed representation of the input. CSAE are specific in the way they differentiate main data and context data by assigning different weights to the reconstruction of main data and context data in their error function. While the applicant has found CSAE to be particularly advantageous in terms of performance for carrying out the embodiments, it is not absolutely necessary to use a CSAE, and other types of autoencoders may be used.

CSAE 6 comprises an encoder and a decoder. The encoder and the decoder are both neural networks tuned such that:

- the input of the encoder is the vectorized data 50 which is output at operations 530 and 560, and the output of the encoder is the similarity embeddings 10 of each of the industrial component models,
- the input 60 of the decoder is the similarity embeddings 10 of each of the industrial component models, and the output of the decoder is an approximation 70 of the vectorized data 50.

For example:

- if the vectorization method is based on bag of words using TFIDF, then approximation 70 should be as close as possible to the input TFIDF of the input vectors, if the vectorization method is based on Doc2vec, then approximation 70 should be as close as possible to the input vector which is the output of the Doc2vec neural network, if the vectorization method is based on BERT, then approximation 70 should be as close as possible to the input vector which is the output of the BERT neural network.

The result of the CSAE 6 which is used for the querying is the similarity embeddings 10. It is clear that the similarity embeddings 10 are abstract embeddings which represent a dimension reduction of the input vectors. As explained above, the CSAE 6 may be replaced by another type of autoencoder, which may not be context sensitive. Alternatively, while autoencoders have been determined to be particularly efficient and cost effective by the applicant, they may be replaced by other means which allow providing of a dimension reduction of the vectorized data, such as PCA (Principal Component Analysis) or SVD (Singular Value Decomposition).

Because of the user feedback introduced in the similarity data which is part of this dimension reduction, it allows progressive skewing of the similarity embeddings towards empirical results. In other words, the more similarity data is input by the users through feedback, the more the similarity embeddings will take into account interchangeability of industrial component models. The system of the disclosure thereby allows embedding of legacy industrial component model attributes with interchangeability information in order to provide new similarity search abilities, which are not tuned by the model used to establish the similarity, but rather by the data itself which influences the resulting similarity embeddings. Furthermore, the notion of industrial component model may encompass the association of independent industrial component models.

The invention claimed is:

1. A computer implemented method for improving a similarity search of an industrial component model, comprising:

obtaining a set of industrial component models, each defining a respective industrial component and each having associated attributes and a similarity embedding that is an embedding of at least a portion of said associated attributes, each respective industrial component being at least one among a mechanical part and an electronic part;

receiving a similarity request using a first industrial component model as an input, an output of said similarity request being a first subset of industrial component models selected from the set of industrial component models based on a comparison between similarity embeddings of the set of industrial component models and a first similarity embedding of the first industrial component model by applying similarity measurement, wherein the first subset of industrial component models includes industrial component models of the set of industrial component models with measured similarity above a given threshold and/or a fixed number of industrial component models of the set of industrial component models with the highest measured similarities;

receiving a second subset of industrial component models selected by a user from said first subset of industrial component models based on an interchangeability criterion of the first industrial component model with any industrial component model of said second subset of industrial component models, the interchangeability criterion being satisfied if the industrial components respectively defined by the industrial component models of the second subset of industrial component models are interchangeable from a design standpoint with the industrial component defined by the first industrial component model;

generating a unique hash code distinct from the first similarity embedding and based on said second subset of industrial component models;

adding said unique hash code as a similarity data to the associated attributes of each industrial component model of said second subset of industrial component models, and updating the similarity embeddings of the industrial component models of the set of industrial component models based on said similarity data.

2. The computer implemented method for improving the similarity search of the industrial component model according to claim 1, wherein the similarity embeddings are embedded by vectorization of the industrial component models attributes, and by embedding of the resulting vectorized data.

3. The computer implemented method for improving the similarity search of the industrial component model according to claim 2, wherein the embedding is performed by a context sensitive autoencoder comprising an encoder and a decoder which are both neural networks wherein the input of the context sensitive autoencoder is said vectorized data and constitutes the input of the encoder, and the output of the encoder constitutes the similarity embeddings, the input of the decoder is the similarity embeddings, and the output of the decoder is a term frequency-inverse document frequency of said vectorized data, and said encoder and decoder are tuned such that the term frequency-inverse document frequency of said vectorized data best approximates said vectorized data.

4. The computer implemented method for improving the similarity search of the industrial component model according to claim 2, wherein the embedding is performed by performing a principal component analysis on a concatenation of an L1-normalization of the attributes with a chosen weight multiplied by the L1-normalization of the similarity data.

5. The computer implemented method for improving the similarity search of the industrial component model according to claim 2, wherein the vectorization is performed by a doc2vec vectorization of text attributes, and by a vectorization of the similarity data which includes adding a column for each unique hash code, and, for each industrial component model, filling this column with 1 if the industrial component model is associated with this unique hash code, and 0 otherwise.

6. The computer implemented method for improving the similarity search of the industrial component model according to claim 2, wherein the vectorization is performed by applying a Bidirectional Encoder Representations from Transformers technique to the industrial component models.

7. A non-transitory computer readable medium having stored thereon a computer program having instructions for improving a similarity search of an industrial component model that when executed by a computer causes the computer to implement a method comprising:

obtaining a set of industrial component models, each defining a respective industrial component and each having associated attributes and a similarity embedding that is an embedding of at least a portion of said associated attributes, each respective industrial component being at least one among a mechanical part and an electronic part;

receiving a similarity request using a first industrial component model as an input, an output of said similarity request being a first subset of industrial component models selected from the set of industrial component models based on a comparison between similarity embeddings of the set of industrial component models and a first similarity embedding of the first industrial component model by applying similarity measurement, wherein the first subset of industrial component models includes industrial component models of the set of industrial component models with measured similarity above a given threshold and/or a fixed number of industrial component models of the set of industrial component models with the highest measured similarities;

receiving a second subset of industrial component models selected by a user from said first subset of industrial component models based on an interchangeability criterion of the first industrial component model with any industrial component model of said second subset of industrial component models, the interchangeability criterion being satisfied if the industrial components respectively defined by the industrial component models of the second subset of industrial component models are interchangeable from a design standpoint with the industrial component defined by the first industrial component model;

generating a unique hash code distinct from the first similarity embedding and based on said second subset of industrial component models;

adding said unique hash code as a similarity data to the associated attributes of each industrial component model of said second subset of industrial component models; and updating the similarity embeddings of the industrial component models of the set of industrial component models based on said similarity data.

8. The non-transitory computer readable medium according to claim 7, wherein the similarity embeddings are embedded by vectorization of the industrial component models attributes, and by embedding of the resulting vectorized data.

9. The non-transitory computer readable medium according to claim 8, wherein the embedding is performed by a context sensitive autoencoder comprising an encoder and a decoder which are both neural networks wherein the input of the context sensitive autoencoder is said vectorized data and constitutes the input of the encoder, and the output of the encoder constitutes the similarity embeddings, the input of the decoder is the similarity embeddings, and the output of the decoder is a term frequency-inverse document frequency of said vectorized data, and said encoder and decoder are tuned such that the term frequency-inverse document frequency of said vectorized data best approximates said vectorized data.

10. The non-transitory computer readable medium according to claim 8, wherein the embedding is performed by performing a principal component analysis on a concatenation of an L1-normalization of the attributes with a chosen weight multiplied by the L1-normalization of the similarity data.

11. The non-transitory computer readable medium according to claim 8, wherein the vectorization is performed by a doc2vec vectorization of text attributes, and by a vectorization of the similarity data which includes adding a column for each unique hash code, and, for each industrial component model, filling this column with 1 if the industrial component model is associated with this unique hash code, and 0 otherwise.

12. The non-transitory computer readable medium according to claim 8, wherein the vectorization is performed by applying a Bidirectional Encoder Representations from Transformers technique to the industrial component models.

13. A computer system comprising:

a processor coupled to a memory, the memory having recorded thereon instructions for improving a similarity search of an industrial component model that when executed by the processor causes the processor to be configured to:

obtain a set of industrial component models, each defining a respective industrial component and each having associated attributes and a similarity embedding that is an embedding of at least a portion of said associated attributes, each respective industrial component being at least one among a mechanical part and an electronic part;

receive a similarity request using a first industrial component model as an input, an output of said similarity request being a first subset of industrial component models selected from the set of industrial component models based on a comparison between similarity embeddings of the set of industrial component models and a first similarity embedding of the first industrial component model by applying similarity measurement, wherein the first subset of industrial component models includes industrial component models of the set of industrial component models with measured similarity above a given threshold and/or a fixed number of industrial component models of the set of industrial component models with the highest measured similarities;

receive a second subset of industrial component models selected by a user from said first subset of industrial component models based on an interchangeability criterion of the first industrial component model with any industrial component model of said second subset of industrial component models, the interchangeability criterion being satisfied if the industrial components respectively defined by the industrial component models of the second subset of industrial component models are interchangeable from a design standpoint with the industrial component defined by the first industrial component model;

generate a unique hash code distinct from the first similarity embedding and based on said second subset of industrial component models;

add said unique hash code as a similarity data to the associated attributes of each industrial component model of said second subset of industrial component models, and update the similarity embeddings of the industrial component models of the set of industrial component models based on said similarity data.

14. The computer system according to claim 13, wherein the similarity embeddings are embedded by vectorization of the industrial component models attributes, and by embedding of the resulting vectorized data.

15. The computer system according to claim 14, wherein the embedding is performed by a context sensitive autoencoder comprising an encoder and a decoder which are both neural networks wherein the input of the context sensitive autoencoder is said vectorized data and constitutes the input of the encoder, and the output of the encoder constitutes the similarity embeddings, the input of the decoder is the similarity embeddings, and the output of the decoder is a term frequency-inverse document frequency of said vectorized data, and said encoder and decoder are tuned such that the term frequency-inverse document frequency of said vectorized data best approximates said vectorized data.

16. The computer system according to claim 14, wherein the embedding is performed by performing a principal component analysis on a concatenation of an L1-normalization of the attributes with a chosen weight multiplied by the L1-normalization of the similarity data.

17. The computer system according to claim 14, wherein the vectorization is performed by a doc2vec vectorization of text attributes, and by a vectorization of the similarity data which includes adding a column for each unique hash code, and, for each industrial component model, filling this column with 1 if the industrial component model is associated with this unique hash code, and 0 otherwise.

18. The computer system according to claim 14, wherein the vectorization is performed by applying a Bidirectional Encoder Representations from Transformers technique to the industrial component models.

* * * * *